(12) United States Patent
Wu (10) Patent No.: US 12,324,359 B2
(45) Date of Patent: Jun. 3, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Yulei Wu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 434 days.

(21) Appl. No.: 17/662,259

(22) Filed: May 6, 2022

(65) Prior Publication Data

US 2022/0320419 A1 Oct. 6, 2022

Related U.S. Application Data

(63) Continuation of application No. PCT/CN2021/112336, filed on Aug. 12, 2021.

(30) Foreign Application Priority Data

Mar. 30, 2021 (CN) .......................... 202110340736.3

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ........ H10N 50/80; H10N 50/01; H10N 50/10; H10B 61/00
See application file for complete search history.

(56) References Cited

U.S. PATENT DOCUMENTS

| 8,796,046 B2 | 8/2014 | Chen et al. |
| 9,048,413 B2 | 6/2015 | Zeng |
| 9,564,403 B2 | 2/2017 | Allinger et al. |
| 10,439,129 B2 | 10/2019 | Houssameddine et al. |
| 10,854,809 B2 | 12/2020 | Zhong et al. |
| 2017/0110653 A1* | 4/2017 | Seo ........................ H10B 61/22 |
| 2018/0269383 A1 | 9/2018 | Briggs et al. |

(Continued)

FOREIGN PATENT DOCUMENTS

| CN | 103443860 A | 12/2013 |
| CN | 104518080 A | 4/2015 |

(Continued)

OTHER PUBLICATIONS

International Search Report cited in PCT/CN2021/112336 mailed Dec. 30, 2021, 9 pages.

*Primary Examiner* — Shih Tsun A Chou
(74) *Attorney, Agent, or Firm* — Syncoda LLC; Feng Ma (57) ABSTRACT

The present disclosure provides a method of manufacturing a semiconductor structure and a semiconductor structure. The method of manufacturing a semiconductor structure includes: providing a substrate; forming bottom contact structures in the substrate; forming a storage unit on each of the bottom contact structures; and forming shielding structures that each wrap around one of the storage units, wherein the shielding structures each include multiple dielectric layers and shielding layers arranged alternately.

11 Claims, 11 Drawing Sheets

(56) References Cited

U.S. PATENT DOCUMENTS

| | | | |
|---|---|---|---|
| 2019/0221732 A1* | 7/2019 | Houssameddine | G11C 11/16 |
| 2020/0119264 A1* | 4/2020 | Yang | H10N 50/80 |
| 2021/0359197 A1* | 11/2021 | Frougier | H10N 50/01 |

FOREIGN PATENT DOCUMENTS

| | | | |
|---|---|---|---|
| CN | 110718473 A | 1/2020 |
| CN | 111587493 A | 8/2020 |
| CN | 111883433 A | 11/2020 |

* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/112336, filed on Aug. 12, 2021, which claims the priority of Chinese Patent Application No. 202110340736.3, titled "METHOD OF MANUFACTURING SEMICONDUCTOR STRUCTURE AND SEMICONDUCTOR STRUCTURE" and filed on Mar. 30, 2021. The entire contents of International Application No. PCT/CN2021/112336 and Chinese Patent Application No. 202110340736.3 are incorporated herein by reference.

TECHNICAL FIELD

The present disclosure relates to the technical field of semiconductors, and in particular to a method of manufacturing a semiconductor structure and a semiconductor structure.

BACKGROUND

An information storage function of a magnetoresistive random access memory (MRAM) is realized by magnetic polarization of the magnetic tunnel junction (MTJ) in the memory structure. However, the magnetic polarization of the magnetic tunnel junction may be affected by external electromagnetic fields. For example, the external electromagnetic fields may distort or change the spin direction of the magnetic tunnel junction, and therefore may interfere with stored information. Existing MRAMs adopt a chip-level shielding structure, which cannot provide strong anti-interference function against external electromagnetic fields.

SUMMARY

According to an aspect, embodiments of the present disclosure provide a method of manufacturing a semiconductor structure, including the following steps: providing a substrate; forming bottom contact structures in the substrate; forming a storage unit on each of the bottom contact structures; and forming shielding structures that each wrap around one of the storage units, wherein the shielding structures each include multiple dielectric layers and shielding layers arranged alternately.

According to another aspect, embodiments of the present disclosure provide a semiconductor structure, including: a substrate; bottom contact structures and storage units located on the substrate, wherein the bottom contact structures are each connected to the bottom of one of the storage units; and shielding structures, each wrapping around one of the storage units, wherein the shielding structures each include multiple dielectric layers and shielding layers that are arranged alternately.

DETAILED DESCRIPTION

Exemplary embodiments will be described below in further detail with reference to the accompanying drawings. The exemplary embodiments may be implemented in various forms, and may not be construed as being limited to those described herein. On the contrary, these embodiments are provided to make the present disclosure comprehensive and complete and to fully convey the concept manifested therein to those skilled in the art. The same reference numerals in the figures indicate the same or similar structures, and thus their detailed descriptions will be omitted.

Referring to FIG. 1 to FIG. 20, which representatively show the schematic diagrams of a semiconductor structure in multiple steps of a method of manufacturing a semiconductor structure proposed by the present disclosure. In the exemplary embodiment, the method of manufacturing a semiconductor structure proposed by the present disclosure is described by taking its application to a magnetoresistive random access memory as an example. It is understandable for those skilled in the art that, in order to apply the relevant design of the present disclosure to other types of semiconductor devices (such as a phase change memory, a resistive memory, a ferroelectric memory, etc.) or other methods, various modifications, additions, substitutions, deletions or other changes may be made to the following specific embodiments, but such changes are still within the scope of the principle of the manufacturing method of a semiconductor structure proposed by the present disclosure.

As shown in FIG. 1 to FIG. 19, in this embodiment, the method of manufacturing a semiconductor structure proposed by the present disclosure includes the following steps:

providing a substrate 110;
forming bottom contact structures 130 in the substrate 110;
forming a storage unit 610 on each of the bottom contact structures 130; and
forming shielding structures that each wrap around one of the storage units 610, wherein the shielding structures each include multiple dielectric layers and shielding layers arranged alternately.

In the present disclosure, multiple dielectric layers and multiple shielding layers are formed on the outside of each storage unit 610; the dielectric layers and the shielding layers are arranged alternately to enhance the reflection and absorption of external electromagnetic fields and achieve a better shielding effect.

For example, in this embodiment, each shielding structure may include a first dielectric layer 500, a first shielding layer 300, a second dielectric layer 400 and a second shielding layer 200 that wrap around the storage unit 610 in order. In other embodiments, the method of manufacturing proposed in the present disclosure may further include forming, on the outside of each storage unit 610, two or more shielding layers and dielectric layers that are alternately arranged with the shielding layers, e.g., referring to the schematic diagram of another embodiment of the semiconductor structure proposed in the present disclosure shown in FIG. 22.

Figure 1:
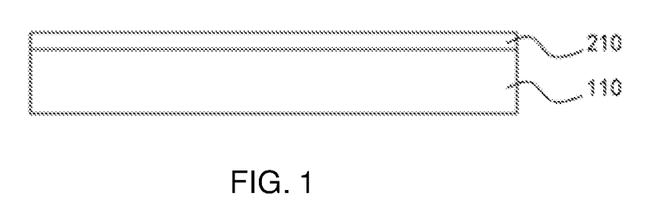
FIG. 1 to FIG. 19 are schematic structural diagrams of a semiconductor structure in multiple steps of a method of manufacturing a semiconductor structure according to an exemplary embodiment.
Figure 2:
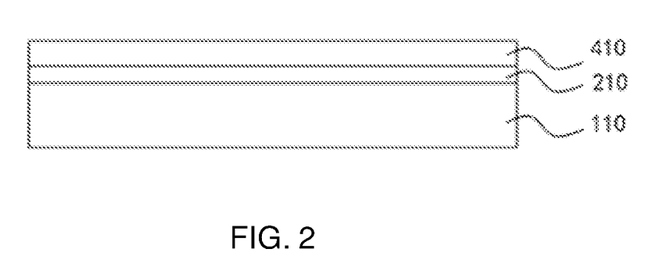
Figure 3:
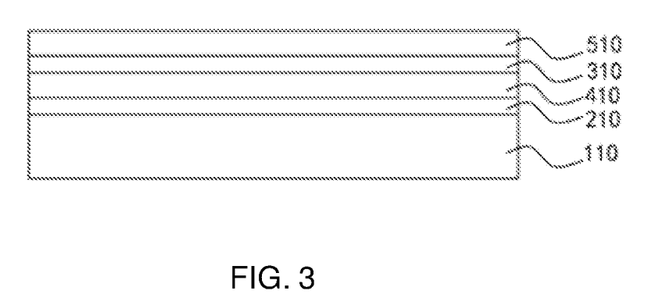

For example, as shown in FIG. 1 to FIG. 14, a method for forming the bottom contact structures 130 in the substrate 110 may include the following steps:

As shown in FIG. 1 to FIG. 3, a third shielding material layer 210, a third dielectric material layer 410, a fourth shielding material layer 310, and a fourth dielectric material layer 510 are sequentially formed on the substrate 110.

Optionally, the substrate 110 may be silicon oxide, silicon nitride, etc., or may be a semiconductor substrate such as silicon, germanium, gallium carbide, gallium arsenide, etc.

Optionally, in this embodiment, materials of the third shielding material layer 210 and the fourth shielding material layer 310 may include alloys of iron (Fe), cobalt (Co) and nickel (Ni), such as ferro-cobalt, ferro-nickel and ferro-nickel-cobalt, other alloys with high magnetic permeability such as various combinations of Ni, Fe and Co, and doped amorphous ferromagnetic alloys, etc. In addition, the materials of the shielding material layers may or may not be the same. The third shielding material layer 210 and the fourth shielding material layer 310 may be formed by PVD or CVD, etc.

Optionally, in this embodiment, materials of the third dielectric material layer 410 and the fourth dielectric material layer 510 include SiN, $SiO_2$, NDC, black diamond (BD), etc. The materials of the dielectric material layers may or may not be the same. The third dielectric material layer 410 and the fourth dielectric material layer 510 may be formed by PVD or CVD, etc.

Figure 4:
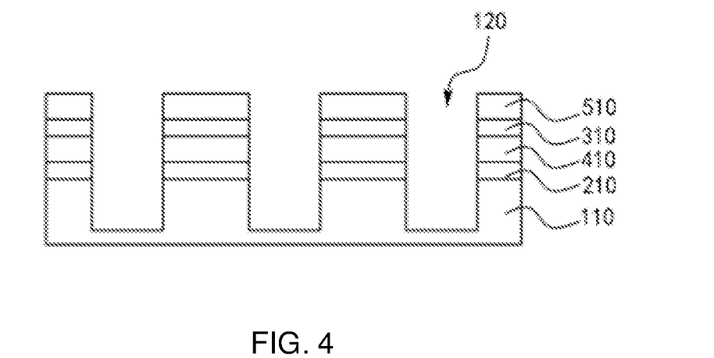

As shown in FIG. 4, a plurality of bottom contact holes 120 are formed in the substrate 110. The bottom contact holes 120 penetrate the third shielding material layer 210, the third dielectric material layer 410, the fourth shielding material layer 310, and the fourth dielectric material layer 510. Specifically, a mask layer may be formed on the fourth dielectric material layer 510, and a lithographic pattern layer is formed on the mask layer, such as a photoresist layer with opening patterns. The third shielding material layer 210, the third dielectric material layer 410, the fourth shielding material layer 310, the fourth dielectric material layer 510, and the substrate 110 are etched by using the lithographic pattern layer and the mask layer, to form the bottom contact holes 120 penetrating the third shielding material layer 210, the third dielectric material layer 410, the fourth shielding material layer 310, and the fourth dielectric material layer 510. The bottom of each bottom contact hole 120 is located in the substrate 110. The mask layer may be a multilayer film structure or a single-layer film structure, such as any one of a silicon oxide layer, a silicon nitride layer, a silicon oxynitride layer or a carbon layer, or any combination thereof.

Figure 5:
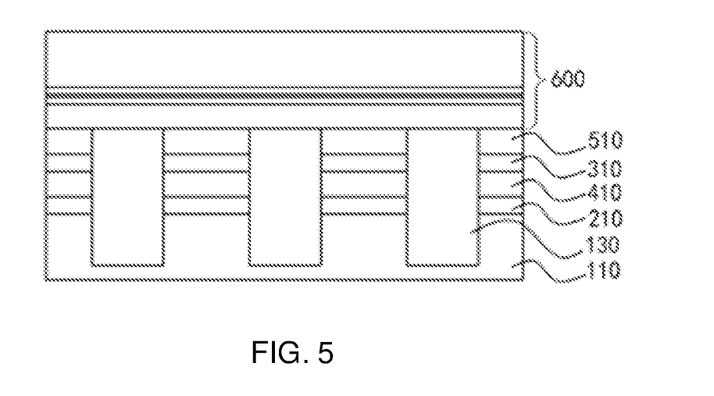

As shown in FIG. 5, a conductive material is filled in the bottom contact holes 120 to form the bottom contact structures 130. Specifically, the conductive material may include a semiconductor conductive material, such as polysilicon, etc., or may include a metal conductive material, such as tungsten, cobalt, etc. A conductive material layer may be formed in the bottom contact holes 120 and on the surface of the fourth dielectric material layer 510 by using PVD, CVD, ALD or other methods. The conductive material layer on the fourth dielectric material layer 510 is removed by etching back or a CMP process, and the conductive material layer in the bottom contact holes 120 is retained to form the bottom contact structures 130. A top surface of each of the bottom contact structures 130 is exposed by a top surface of the fourth dielectric material layer 510.

For example, a method for forming the storage unit 610 on each of the bottom contact structures 130 includes:

As shown in FIG. 5, a storage material layer 600 is formed on the fourth dielectric material layer 510 and the bottom contact structures 130.

Figure 23:
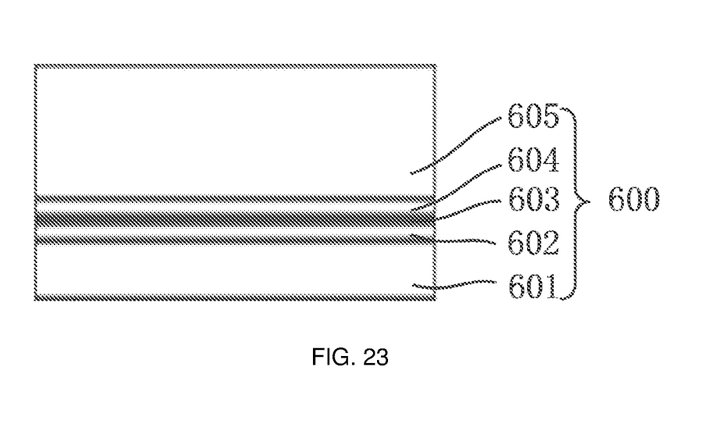
FIG. 23 is an enlarged view of a storage material layer in FIG. 5.

Optionally, as shown in FIG. 23, FIG. 23 is an enlarged view of the storage material layer 600 in FIG. 5. The storage material layer 600 includes a bottom electrode material layer 601, a free material layer 602, a tunneling barrier material layer 603, a fixed material layer 604, and a top electrode material layer 605 that are sequentially stacked. For example, materials of the bottom electrode material layer 601 and the top electrode material layer 605 include, but are not limited to, W, TiN, Ta, TaN, etc. Materials of the free material layer 602 and the fixed material layer 604 include, but are not limited to, CoBTa, CoFeB, or CoFeBTa, etc. A material of the tunneling barrier material layer 603 includes, but is not limited to, MgO, etc. Specifically, the foregoing material layers may be formed by PVD, CVD or other processes.

Figure 6:
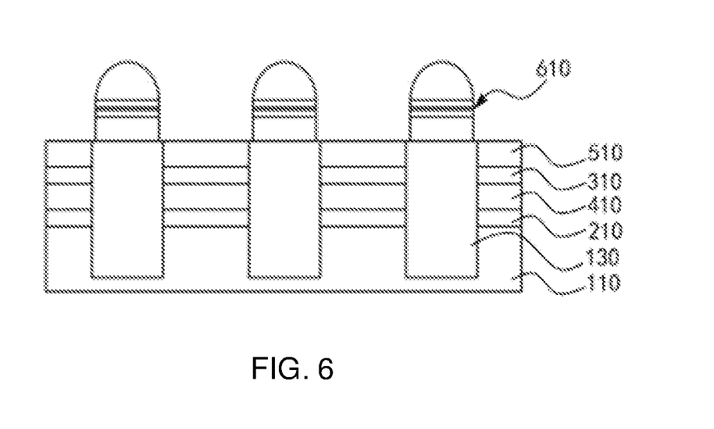

A mask layer with opening patterns is formed on the storage material layer 600. Specifically, a mask layer can be formed on the top electrode material layer 605; a lithographic pattern layer, such as a photoresist layer with opening patterns, can be formed on the mask layer, and the mask layer is etched by using the lithographic pattern layer to form opening patterns on the mask layer. The mask layer may be a multilayer film structure or a single-layer film structure, such as any one of a silicon oxide layer, a silicon nitride layer, a silicon oxynitride layer or a carbon layer, or any combination thereof. The bottom electrode material layer 601, the free material layer 602, the tunneling barrier material layer 603, the fixed material layer 604 and the top electrode material layer 605 are etched by using the mask layer to form a plurality of discrete storage units 610 on the fourth dielectric material layer 510, as shown in FIG. 6, the storage units 610 being correspondingly connected to the bottom contact structures 130 in a one-to-one manner.

Optionally, the top of the storage unit 610 is arc-shaped Specifically, the etched top electrode material layer 605 has an arc-shaped top. The arc-shaped top can increase the distance between the tops of different storage units 610 and reduce the risk of short circuiting between adjacent storage units 610. At the same time, the arc-shaped tops help fill the dielectric layer between the storage units 610 subsequently.

Figure 7:
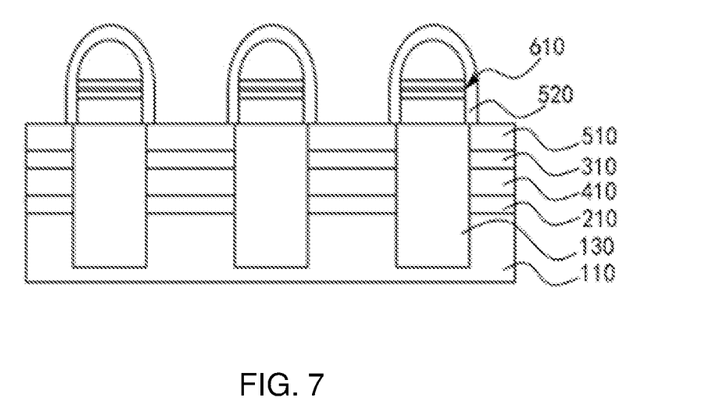

For example, a method for forming the shielding structures that each wrap around one of storage units 610 includes:

As shown in FIG. 7, a fifth dielectric material layer 520 is formed on the surface of each storage unit 610. Specifically, the fifth dielectric material layer 520 is formed on the top surface and two side surfaces of each storage unit 610 and the fourth dielectric material layer 510 between the storage units 610 by using a deposition process such as CVD. A material of the fifth dielectric material layer 520 includes SiN, $SiO_2$, NDC, black diamond (BD), etc. Specifically, a mask pattern layer may be formed on the fifth dielectric material layer 520. The mask pattern layer exposes the fifth dielectric material layer 520 on the fourth dielectric material layer 510 between the storage units 610, and the mask pattern layer may be a photoresist layer. The fifth dielectric material layer 520 on the fourth dielectric material layer 510 between the storage units 610 is etched away by using the mask pattern layer, and the fifth dielectric material layer 520 located on the top surface and two side surfaces of the storage unit 610 is retained.

Figure 8:
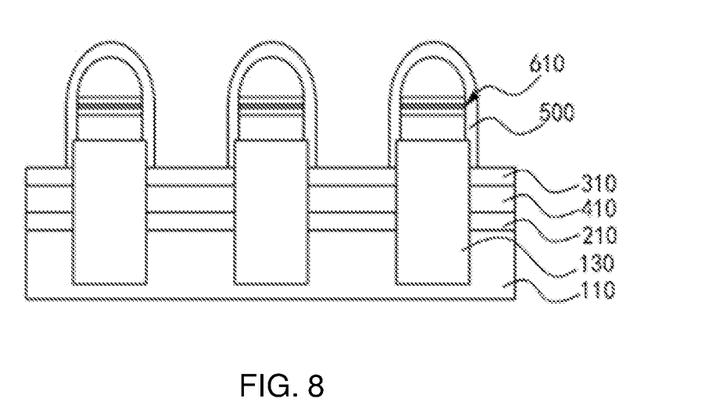

As shown in FIG. 8, the fourth dielectric material layer 510 between the storage units 610 is partially removed. Specifically, the part between the storage units 610 and not covered by the fifth dielectric material layer 520 on the sidewalls of each storage unit 610 may be removed by etching, and the fourth dielectric material layer 510 under the fifth dielectric material layer 520 on the sidewalls of each storage unit 610 is retained. The fifth dielectric material layer 520 and the remaining fourth dielectric material layer 510 after etching are connected as a whole to form the first dielectric layer 500 that surrounds the storage unit 610. Materials of the fifth dielectric material layer 520 and the fourth dielectric material layer 510 may be the same or different.

Figure 9:
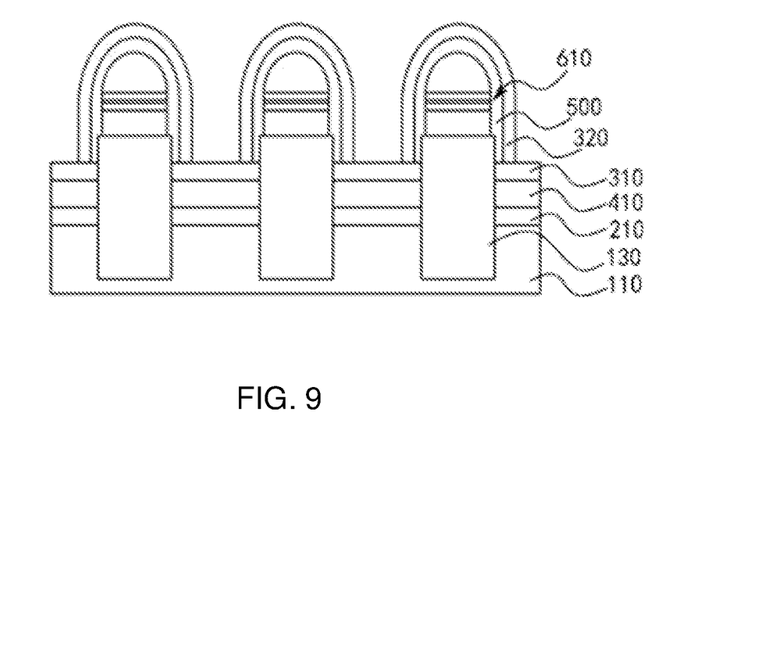

As shown in FIG. 9, a fifth shielding material layer 320 is formed on the surface of the fifth dielectric material layer. Specifically, the fifth shielding material layer 320 is formed on the top surface and two side surfaces of the fifth dielectric material layer and the fourth shielding material layer 310 between the storage units 610 by using a deposition process such as CVD or PVD. A material of the fifth shielding material layer 320 may include alloys of iron (Fe), cobalt (Co) and nickel (Ni), such as ferro-cobalt, ferro-nickel and ferro-nickel-cobalt, other alloys with high magnetic permeability such as various combinations of Ni, Fe and Co, and doped amorphous ferromagnetic alloys, etc. Specifically, a mask pattern layer may be formed on the fifth shielding material layer 320. The mask pattern layer exposes the fifth shielding material layer 320 on the fourth shielding material layer 310 between the storage units 610, and the mask pattern layer may be a photoresist layer. The fifth shielding material layer 320 on the fourth shielding material layer 310 between the storage units 610 is etched away by using the mask pattern layer, and the fourth shielding material layer 310 on the top surface and two side surfaces of the fifth dielectric material layer is retained.

Optionally, the fifth shielding material layer 320 is further formed on sidewalls of the fourth dielectric material layer 510 under the fifth dielectric material layer on the sidewalls of each storage unit 610. The fifth shielding material layer 320 on the sidewalls of the fourth dielectric material layer 510 is in direct contact with the fourth shielding material layer 310.

Figure 10:
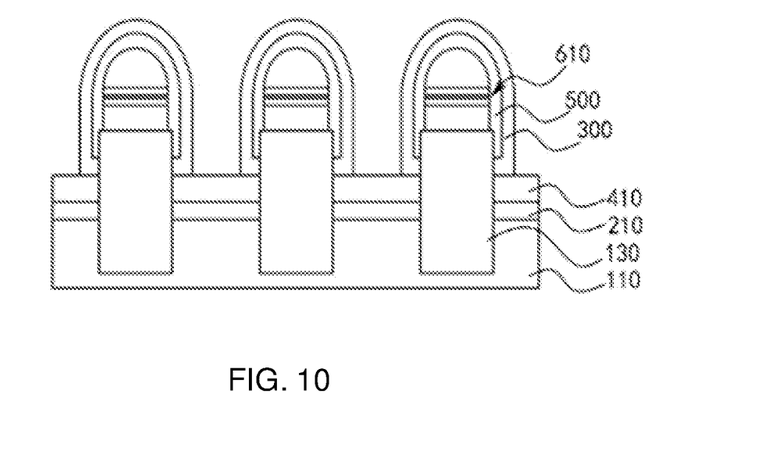

As shown in FIG. 10, the fourth shielding material layer 310 between the storage units 610 is partially removed. Specifically, the part that is between the storage units 610 and not covered by the fifth shielding material layer 320 is removed by etching, and the fourth shielding material layer 310 under the first dielectric layer 500 and the fifth shielding material layer 320 is retained. The fifth shielding material layer 320 and the remaining fourth shielding material layer 310 after etching are connected as a whole to form the first shielding layer 300 that surrounds the storage unit 610. Materials of the fifth shielding material layer 320 and the fourth shielding material layer 310 may be the same or different.

Figure 11:
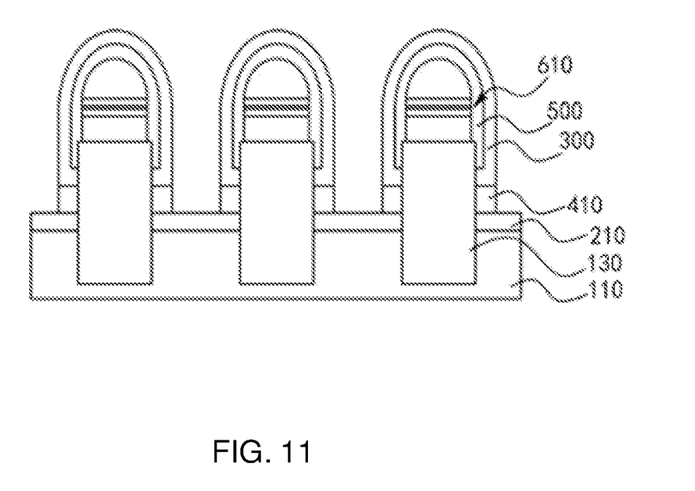

As shown in FIG. 11, the third dielectric material layer 410 between the storage units 610 is partially removed. Specifically, a mask pattern layer may be formed on the fifth shielding material layer 320. The mask pattern layer exposes the third dielectric material layer 410 on the third shielding material layer 210 between the storage units 610, and the mask pattern layer may be a photoresist layer. The third dielectric material layer 410 on the third shielding material layer 210 between the storage units 610 is etched away by using the mask pattern layer, and the third dielectric material layer 410 under the fifth shielding material layer 320 is retained. For example, the third dielectric material layer 410 under the first shielding layer 300 can all be retained.

Figure 12:
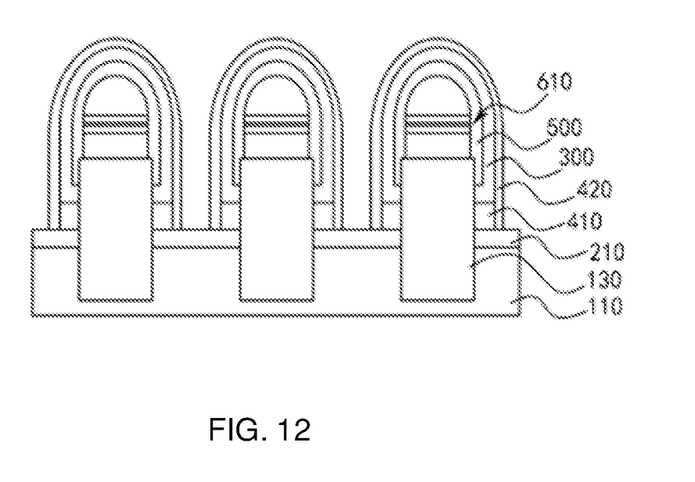
Figure 13:
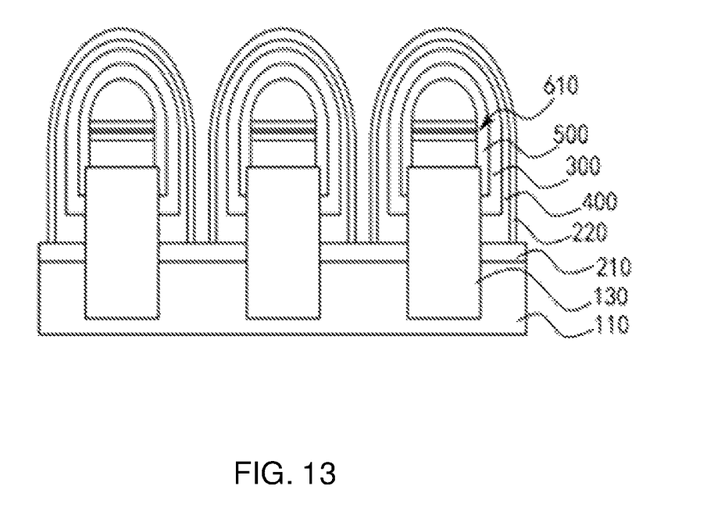

As shown in FIG. 12, a sixth dielectric material layer 420 is formed on the surface of the fifth shielding material layer. Specifically, the sixth dielectric material layer 420 may be formed on the top surface and two side surfaces of the fifth shielding material layer 320 and the third shielding material layer 210 between the storage units 610 by using a deposition process such as CVD. A material of the sixth dielectric material layer 420 includes SiN, SiO$_2$, NDC, black diamond (BD), etc. The sixth dielectric material layer 420 between the storage units 610 is removed by etching, and the sixth dielectric material layer 420 on the sidewalls of each storage unit 610 is retained. As shown in FIG. 13, the sixth dielectric material layer 420 and the third dielectric material layer 410 are connected as a whole to form a second dielectric layer 400 that surrounds the storage unit 610. Materials of the sixth dielectric material layer 420 and the third dielectric material layer 410 may be the same or different. Specifically, the third dielectric material layer 410 between the storage units 610 may be partially removed first, and the third dielectric material layer 410 under the first shielding layer 300 is retained. Then, the sixth dielectric material layer 420 is formed on the surface of the first shielding layer 300 and sidewalls of the remaining third dielectric material layer 410. This can avoid damage to the sixth dielectric material layer 420 on the surface of the first shielding layer 300 in the process of removing the third dielectric material layer 410 between the storage units 610.

Figure 14:
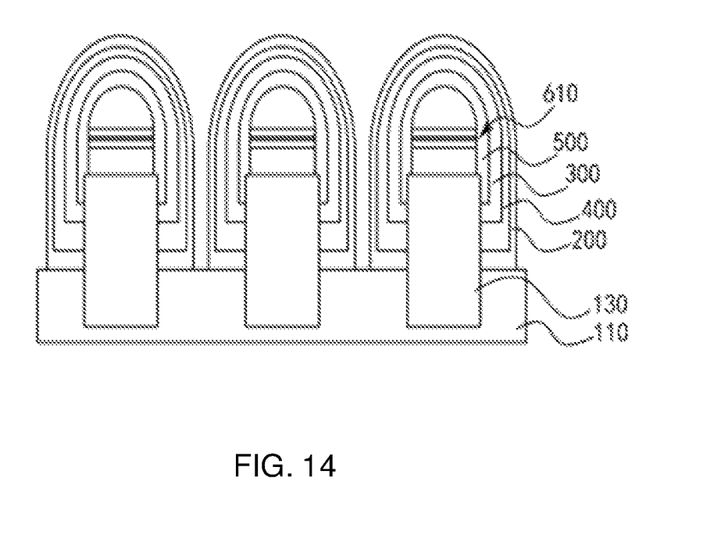

As shown in FIG. 13, a sixth shielding material layer 220 is formed on the surface of the sixth dielectric material layer 420. Specifically, the sixth shielding material layer 220 is formed on the top surface and two side surfaces of the sixth dielectric material layer 420 and the third shielding material layer 210 between the storage units 610 by using a deposition process such as CVD or PVD. A material of the sixth shielding material layer 220 may include alloys of iron (Fe), cobalt (Co) and nickel (Ni), such as ferro-cobalt, ferro-nickel and ferro-nickel-cobalt, other alloys with high magnetic permeability such as various combinations of Ni, Fe and Co, and doped amorphous ferromagnetic alloys, etc. Specifically, a mask pattern layer may be formed on the sixth shielding material layer 220. The mask pattern layer exposes the sixth shielding material layer 220 on the third shielding material layer 210 between the storage units 610, and the mask pattern layer may be a photoresist layer. The third shielding material layer 210 and the sixth shielding material layer 220 that are between the storage units 610 are etched away by using the mask pattern layer; the sixth shielding material layer 220 on the top surface and two side surfaces of the sixth dielectric material layer 420, and the third shielding material layer 210 under the sixth shielding material layer 220 are retained. As shown in FIG. 14, the sixth shielding material layer 220 and the third shielding material layer 210 are connected as a whole to form the second shielding layer 200 that surrounds the storage unit 610. Materials of the sixth shielding material layer 220 and the third shielding material layer 210 may be the same or different.

For example, the manufacturing method further includes: forming a top contact structure 740 on each storage unit 610, wherein the top contact structure 740 penetrates the shielding layers and is connected to the top electrode material layer.

Figure 15:
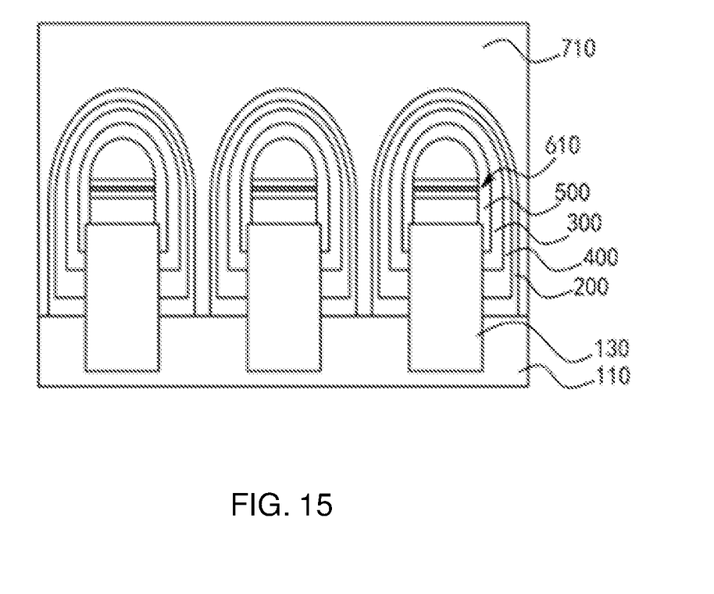
Figure 16:
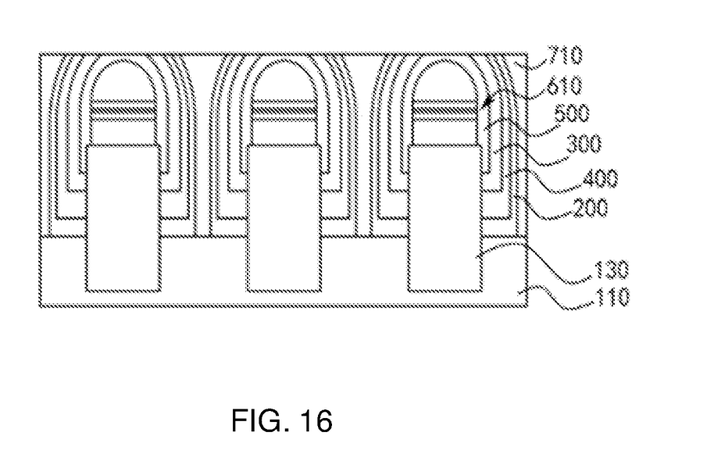
Figure 17:
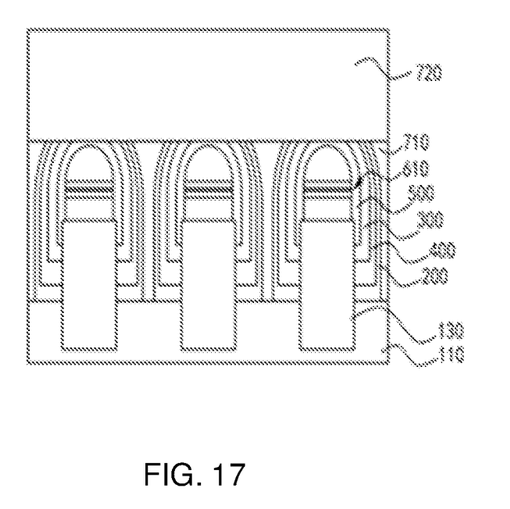

Specifically, as shown in FIG. 15 to FIG. 17, a seventh dielectric material layer 710 covering the storage units 610 is formed; the seventh dielectric material layer 710 as well as the top of the first dielectric layer 500, the top of the first shielding layer 300, the top of the second dielectric layer 400, and the top of the second shielding layer 200 are partially removed by a CMP process, such that the top of the remaining first dielectric layer 500, the top of the remaining first shielding layer 300, the top of the remaining second dielectric layer 400, and the top of the remaining second shielding layer 200 are exposed by the surface of the remaining seventh dielectric material layer 710. As shown in FIG. 16, the shielding structures have flush top surfaces.

Optionally, the seventh dielectric material layer 710 as well as the top of the first dielectric layer 500, the top of the first shielding layer 300, the top of the second dielectric layer 400, and the top of the second shielding layer 200 are partially removed by a CMP process, such that the top of the remaining first dielectric layer 500, the top of the remaining first shielding layer 300, the top of the remaining second dielectric layer 400, and the top of the remaining second shielding layer 200 are exposed by the surface of the remaining seventh dielectric material layer 710, and that the top of each storage unit 610 is exposed by the top of the remaining seventh dielectric material layer 710. Specifically, the top electrode material layer of each storage unit 610 is exposed by the surface of the remaining seventh dielectric material layer 710, the top electrode material layers and the shielding structures are having flush top surfaces. For example, the top surface of the top electrode material layer is flush with those of the first dielectric layer 500, the first shielding layer 300, the second dielectric layer 400, and the second shielding layer 200. Specifically, the top electrode material layer has an arc-shaped top surface. The first dielectric layer 500, the first shielding layer 300, the second dielectric layer 400 and the second shielding layer 200 that are sequentially formed on the top surface of the top electrode material layer also have an arc-shaped top surface, and are ground using a CMP process until the top electrode material layer is exposed, in order to form a top contact structure 740 connected to the top electrode material layer in a subsequent process, thus avoiding the alignment problem caused by the lithography and etching process and the difficult etching of the multiple shielding layers and dielectric layers.

Figure 18:
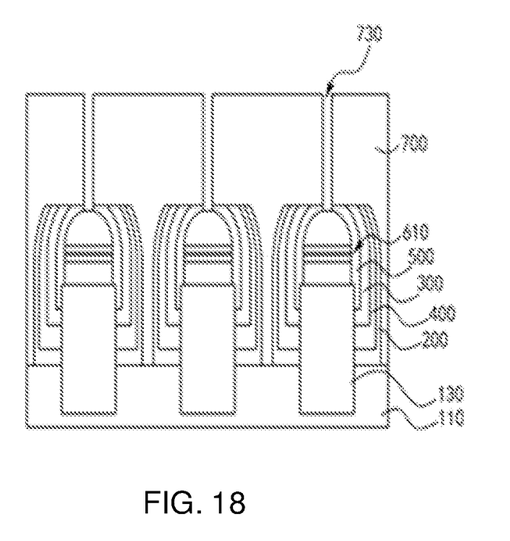

An eighth dielectric material layer 720 is formed on the surface of the remaining seventh dielectric material layer 710, such that the eighth dielectric material layer 720 and the remaining seventh dielectric material layer 710 form an interlayer electric dielectric layer 700. As shown in FIG. 17, representatively shows a schematic structural diagram of a step of "forming an eighth dielectric material layer 720" (i.e., step of "forming an interlayer electric dielectric layer 700") in the semiconductor structure. Specifically, in the foregoing step, the semiconductor structure includes the substrate 110, the bottom contact structures 130, the storage units 610 (each of which is surrounded by the first dielectric layer 500, the first shielding layer 300, the second dielectric layer 400, and the second shielding layer 200 sequentially), the remaining seventh dielectric material layer 710, and the eighth dielectric material layer 720 after being partially removed. The eighth dielectric material layer 720 is formed on the surface of the remaining seventh dielectric material layer 710, and covers the exposed parts of each dielectric layer and each shielding layer. As shown in FIG. 18, the eighth dielectric material layer 720 and the remaining seventh dielectric material layer 710 after being partially removed together form the interlayer electric dielectric layer 700.

Figure 19:
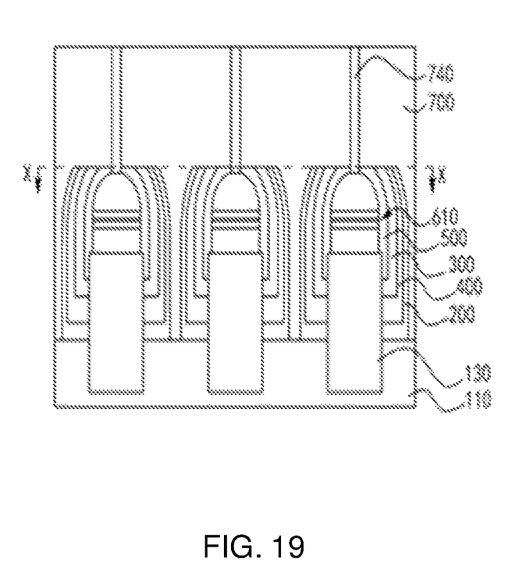

Optionally, as shown in FIG. 18 and FIG. 19, in this embodiment, formation of the top contact structures 740 includes the following steps:

forming top contact holes 730 in the interlayer electric dielectric layer 700, the top contact holes 730 each penetrating the shielding layers and the dielectric layers, such that the top of each storage unit 610 is exposed by the bottom of the top contact hole 730; and forming the top contact structure 740 in each top contact hole 730, wherein the bottom of the top contact structure 740 is in contact with the storage unit 610. The top contact structure 740 may be formed by a metal conductive material filled in the top contact hole 730. In addition to the parts in contact with the bottom contact structure 130 and the top contact structure 740, the remaining part of each storage unit 610 is surrounded by the shielding structure having multiple (e.g., two) shielding layers and dielectric layers.

Figure 20:
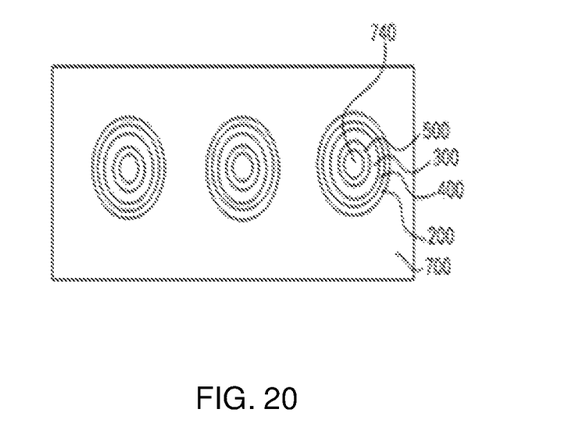
FIG. 20 is a cross-sectional view of the semiconductor structure taken along line X-X in the method shown in FIG. 19.

Referring to FIG. 20, FIG. 20 representatively shows a cross-sectional view of the semiconductor structure taken along line X-X in the method shown in FIG. 19.

As shown in FIG. 20, the shape of the multiple shielding layers and dielectric layers around each storage unit 610 can be observed in this view; the shielding layers and the dielectric layers alternately surround the storage unit 610, forming an annular shielding structure. For example, in the above embodiment, there are two shielding layers and two dielectric layers surrounding each storage unit 610. The ring shape of the first dielectric layer 500, the ring shape of the first shielding layer 300, the ring shape of the second dielectric layer 400 and the ring shape of the second shielding layer 200 are shown along the direction from the inside to the outside of the storage unit 610.

In summary, the method of manufacturing a semiconductor structure proposed in the present disclosure adopts the design of forming multiple dielectric layers and multiple shielding layers on the outside of each storage unit 610, wherein the dielectric layers and the shielding layers are arranged alternately. The semiconductor structure can realize multiple times of reflection and absorption of electromagnetic fields by using the above-mentioned shielding layers and dielectric layers to achieve a better shielding effect.

Based on the above detailed description of an exemplary embodiment of the semiconductor structure proposed in the present disclosure, another exemplary embodiment of the semiconductor structure proposed in the present disclosure is described below with reference to FIG. 22.

Figure 22:
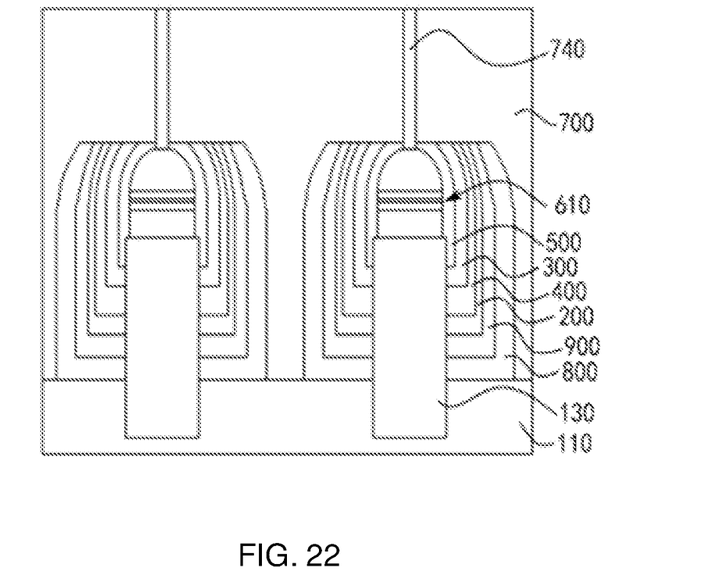
FIG. 22 is a schematic structural diagram of a semiconductor structure according to another exemplary embodiment.

As shown in FIG. 22, in this embodiment, each storage unit 610 of the semiconductor structure proposed in the present disclosure is surrounded by three dielectric layers and three shielding layers, wherein the dielectric layers and shielding layers are arranged alternately. Specifically, based on the description of the first embodiment of the semiconductor structure described above, in this embodiment, the second shielding layer 200 is surrounded by a third dielectric layer 900, and the third dielectric layer 900 is further surrounded by a third shielding layer 800.

Figure 21:
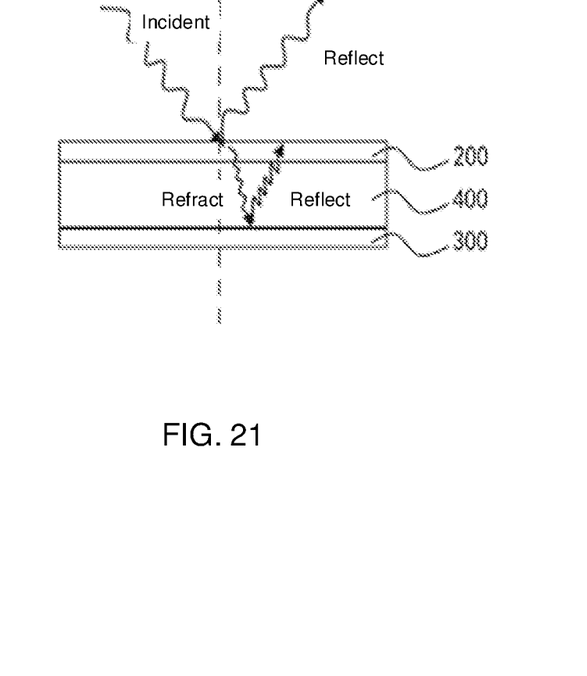
FIG. 21 is a schematic diagram of a principle of shielding external electromagnetic fields by the semiconductor structure in the method shown in FIG. 19.

Referring to FIG. 21, FIG. 21 representatively shows a schematic diagram of a principle of shielding external electromagnetic fields by the semiconductor structure in the method shown in FIG. 19.

As shown in FIG. 21, in the method of manufacturing a semiconductor structure proposed in the present disclosure, each storage unit 610 is wrapped by a multi-layer shielding structure. Taking part of the shielding structure, such as the first shielding layer 300, the second shielding layer 200 and the second dielectric layer 400 between the first shielding layer 300 and the second shielding layer 200 as an example, it can be observed that when the electromagnetic field incident from the outside reaches the second shielding layer 200, part of the electromagnetic fields is directly reflected by the second shielding layer 200. The electromagnetic fields that are not reflected by the surface of the second shielding layer 200 and enter the second shielding layer 200 are attenuated by the second shielding layer 200 during the forward propagation in the second shielding layer 200. That is, the second shielding layer 200 will absorb the electromagnetic fields, and the remaining part after absorption will be reflected by the first shielding layer 300 again, and return to the first shielding layer 300 again, which will also absorb and attenuate the electromagnetic fields. The reflection may occur several times between the intersections of two shielding layers, to finally achieve the purpose of shielding through multiple times of reflection, absorption and attenuation.

Accordingly, the semiconductor structure made by using the method of manufacturing a semiconductor structure proposed in the present disclosure has multiple immunity layers for external electric fields (shielding structures with multiple shielding layers), thus achieving effective shielding against the external electromagnetic fields by multiple times of reflection and absorption of the electromagnetic fields.

Based on the above detailed description of several exemplary embodiments of the method of manufacturing a semiconductor structure proposed in the present disclosure, an exemplary embodiment of the semiconductor structure proposed in the present disclosure is described below with reference to FIG. 19.

As shown in FIG. 19, in this embodiment, the semiconductor structure proposed by the present disclosure includes:
  a substrate 110;
  bottom contact structures 130 and storage units 610 located on the substrate 110, wherein the bottom contact structures 130 are each connected to the bottom of one of the storage units 610; and
  shielding structures, each wrapping around one of the storage units 610, wherein the shielding structures each include multiple dielectric layers and shielding layers that are arranged alternately.

Optionally, the shielding structures each include a first dielectric layer 500, a first shielding layer 300, a second dielectric layer 400, and a second shielding layer 200 wrapping around each storage unit 610 in order.

Optionally, the dielectric layers and the shielding layers are further located below the storage units 610.

Optionally, the storage units 610 each include a bottom electrode material layer, a free material layer, a tunneling barrier material layer, a fixed material layer, and a top electrode material layer, the bottom contact structure 130 being connected to the bottom electrode material layer; and the semiconductor structure further includes: top contact structures 740, each of the top contact structures 740 is connected to the top electrode material layer.

Optionally, the top electrode material layer has an arc-shaped top.

Optionally, the shielding structures have flush top surfaces.

Optionally, the top electrode material layers and the shielding structures have flush top surfaces.

Based on the above detailed description of an exemplary embodiment of the semiconductor structure proposed in the present disclosure, another exemplary embodiment of the semiconductor structure proposed in the present disclosure is described below with reference to FIG. 22.

As shown in FIG. 22, in this embodiment, each storage unit 610 of the semiconductor structure proposed in the present disclosure is surrounded by three dielectric layers and three shielding layers, wherein the dielectric layers and shielding layers are arranged alternately. Specifically, based on the description of the first embodiment of the semiconductor structure described above, in this embodiment, the second shielding layer 200 is surrounded by a third dielectric layer 900, and the third dielectric layer 900 is further surrounded by a third shielding layer 800.

Accordingly, it is understandable that in various possible embodiments conforming to the design concepts of the semiconductor structure proposed in the present disclosure. The semiconductor structure includes storage units 610, and the storage units 610 are each surrounded by multiple dielectric layers and multiple shielding layers, wherein the dielectric layers and the shielding layers are arranged alternately.

In summary, the semiconductor structure proposed in the present disclosure adopts the structure design of forming multiple dielectric layers and multiple shielding layers on the outside of each storage unit, wherein the dielectric layers and the shielding layers are arranged alternately. In this way, the electromagnetic field can be reflected and absorbed by using the foregoing shielding layers and dielectric layers, to minimize the interference from the external electromagnetic field.

The present disclosure is described above with reference to several typical implementations. It should be understood that the terms used herein are intended for illustration, rather than limiting. The present disclosure may be specifically implemented in many forms without departing from the spirit or essence of the present disclosure. Therefore, it should be understood that the above embodiments are not limited to any of the above-mentioned details, but should be broadly interpreted according to the spirit and scope defined by the appended claims. Therefore, any changes and modifications falling within the claims or the equivalent scope thereof should be covered by the appended claims.

The invention claimed is:

1. A method of manufacturing a semiconductor structure, the method comprising:
  providing a substrate;
  forming bottom contact structures in the substrate;
  forming a storage unit on each of the bottom contact structures; and
  forming shielding structures that each wrap around one of the storage units, wherein the shielding structures each comprise multiple dielectric layers and shielding layers arranged alternately;
  wherein forming the bottom contact structures in the substrate comprising:
  sequentially forming a third shielding material layer, a third dielectric material layer, a fourth shielding material layer, and a fourth dielectric material layer on the substrate;
  forming a plurality of bottom contact holes in the substrate, the bottom contact holes each penetrating the third shielding material layer, the third dielectric material layer, the fourth shielding material layer, and the fourth dielectric material layer; and
  filling a conductive material in each bottom contact hole.

2. The method of manufacturing the semiconductor structure according to claim 1, the shielding structures each comprising:

a first dielectric layer, a first shielding layer, a second dielectric layer, and a second shielding layer that wrap around the storage unit in order.

3. The method of manufacturing the semiconductor structure according to claim 2, wherein
the shielding structures have flush top surfaces, and the dimensions of the first dielectric layer, the first shielding layer, the second dielectric layer, and the second shielding layer increase in order in a height direction.

4. The method of manufacturing the semiconductor structure according to claim 1, wherein each of the shielding structures also wrap part of each of the bottom contact structures.

5. The method of manufacturing the semiconductor structure according to claim 1, wherein
a top of the storage unit is arc-shaped.

6. A method of manufacturing a semiconductor structure, the method comprising:
providing a substrate;
forming bottom contact structures in the substrate;
forming a storage unit on each of the bottom contact structures; and
forming shielding structures that each wrap around one of the storage units, wherein the shielding structures each comprise multiple dielectric layers and shielding layers arranged alternately;
wherein the shielding structures each comprising:
a first dielectric layer, a first shielding layer, a second dielectric layer, and a second shielding layer that wrap around the storage unit in order; and
wherein forming the bottom contact structures in the substrate comprising:
sequentially forming a third shielding material layer, a third dielectric material layer, a fourth shielding material layer, and a fourth dielectric material layer on the substrate;
forming a plurality of bottom contact holes in the substrate, the bottom contact holes each penetrating the third shielding material layer, the third dielectric material layer, the fourth shielding material layer, and the fourth dielectric material layer; and
filling a conductive material in each bottom contact hole.

7. The method of manufacturing the semiconductor structure according to claim 6, wherein forming the storage unit on each of the bottom contact structures comprising:
sequentially forming a bottom electrode material layer, a free material layer, a tunneling barrier material layer, a fixed material layer, and a top electrode material layer on the fourth dielectric material layer;
forming a mask layer with opening patterns on the top electrode material layer; and
etching the bottom electrode material layer, the free material layer, the tunneling barrier material layer, the fixed material layer, and the top electrode material layer by using the mask layer, to form a plurality of discrete storage units on the fourth dielectric material layer, wherein the storage units are correspondingly connected to the bottom contact structures in a one-to-one manner.

8. The method of manufacturing the semiconductor structure according to claim 4, wherein forming the shielding structures that each wrap around one of the storage units comprising:
forming a fifth dielectric material layer on a surface of each storage unit;
partially removing the fourth dielectric material layer between the storage units;
forming a fifth shielding material layer on a surface of each fifth dielectric material layer;
partially removing the fourth shielding material layer between the storage units;
partially removing the third dielectric material layer between the storage units;
forming a sixth dielectric material layer on a surface of each fifth shielding material layer;
forming a sixth shielding material layer on a surface of each sixth dielectric material layer; and
partially removing the third shielding material layer between the storage units.

9. The method of manufacturing the semiconductor structure according to claim 8, wherein
the partially removing the fourth dielectric material layer between the storage units, the fourth dielectric material layer under the fifth dielectric material layer on sidewalls of each storage unit is retained;
the partially removing the fourth shielding material layer between the storage units, the fourth shielding material layer under the fifth shielding material layer on the sidewalls of each storage unit is retained;
the partially removing the third dielectric material layer between the storage units, the third dielectric material layer under the fifth shielding material layer that is on the sidewalls of each storage unit is retained; and
the partially removing the third shielding material layer between the storage units, the third shielding material layer under the sixth shielding material layer that is on the sidewalls of each storage unit is retained.

10. The method of manufacturing the semiconductor structure according to claim 9, wherein
the first dielectric layer comprises the fifth dielectric material layer and the fourth dielectric material layer that are connected as a whole;
the first shielding layer comprises the fifth shielding material layer and the fourth shielding material layer that are connected as a whole;
the second dielectric layer comprises the third dielectric material layer and the sixth dielectric material layer that are connected as a whole; and
the second shielding layer comprises the third shielding material layer and the sixth shielding material layer that are connected as a whole.

11. The method of manufacturing the semiconductor structure according to claim 10, further comprising:
forming a top contact structure on each storage unit, the top contact structure penetrating the shielding layers and being connected to the top electrode material layer.

* * * * *